United States Patent
Lee et al.

(10) Patent No.: US 10,347,186 B2
(45) Date of Patent: Jul. 9, 2019

(54) DISPLAY PANEL DRIVING UNIT, DRIVING METHOD THEREOF, AND DISPLAY DEVICE INCLUDING THE SAME

(71) Applicant: LG Display Co., Ltd., Seoul (KR)

(72) Inventors: Juseok Lee, Paju-si (KR); HaeSeung Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/714,745

(22) Filed: Sep. 25, 2017

(65) Prior Publication Data

US 2018/0096656 A1    Apr. 5, 2018

(30) Foreign Application Priority Data

Sep. 30, 2016    (KR) .................. 10-2016-0126328

(51) Int. Cl.
```
G09G 3/3258    (2016.01)
G09G 3/20      (2006.01)
G09G 3/3266    (2016.01)
G09G 3/3291    (2016.01)
G09G 3/3233    (2016.01)
H03K 19/21     (2006.01)
```

(52) U.S. Cl.
CPC ......... *G09G 3/3258* (2013.01); *G09G 3/2096* (2013.01); *G09G 3/3233* (2013.01); *G09G 3/3266* (2013.01); *G09G 3/3291* (2013.01); *G09G 2300/0426* (2013.01); *G09G 2300/0819* (2013.01); *G09G 2310/0289* (2013.01); *G09G 2310/063* (2013.01); *G09G 2310/08* (2013.01); *G09G 2320/0295* (2013.01); *G09G 2320/045* (2013.01); *G09G 2320/0693* (2013.01); *G09G 2330/021* (2013.01); *G09G 2330/026* (2013.01); *G09G 2330/028* (2013.01); *H03K 19/21* (2013.01)

(58) Field of Classification Search
CPC .. G09G 3/3258; G09G 3/2096; G09G 3/3266; G09G 3/3291; G09G 3/3233; G09G 2310/08; G09G 2310/0289; G09G 2310/063; G09G 2330/026; G09G 2320/0693; G09G 2300/0426; G09G 2330/021
See application file for complete search history.

(56) References Cited

U.S. PATENT DOCUMENTS

2007/0262976 A1* 11/2007 Matsuda .............. G09G 3/3611
                                                      345/208
2008/0174545 A1*  7/2008 Ezaki .................. G09G 3/3406
                                                      345/102

* cited by examiner

*Primary Examiner* — Md Saiful A Siddiqui
(74) *Attorney, Agent, or Firm* — Birch, Stewart, Kolasch & Birch, LLP

(57) ABSTRACT

A display panel driving unit can include: a timing controller to supply a power on reset signal for starting a sensing operation for pixel compensation during a sensing period before displaying an image; a power management integrated circuit (PMIC) to supply a high level reference voltage reset signal to the timing controller, and generate a control signal; and a control circuit to receive the high level reference voltage reset signal and the PMIC, in response to the high level reference voltage reset signal transitioning from a high to low logic level and then from the low logic level back to the high logic level, shift the power on reset signal to transition from a high to low logic level and then from the low logic level back to high, to follow the high level reference voltage reset signal, and supply the power on reset signal to the timing controller.

15 Claims, 9 Drawing Sheets

DISPLAY PANEL DRIVING UNIT, DRIVING METHOD THEREOF, AND DISPLAY DEVICE INCLUDING THE SAME

CROSS-REFERENCE TO RELATED APPLICATIONS

This application claims the benefit of the Korean Patent Application No. 10-2016-0126328 filed in the Republic of Korea on Sep. 30, 2016, which is hereby incorporated by reference as if fully set forth herein.

BACKGROUND

Field of the Invention

The present disclosure relates to a display panel driving unit, a driving method thereof, and a display device including the same.

Discussion of the Related Art

In information-oriented society, technology relevant to the field of display devices for displaying visual information as a video or an image is being developed. The display devices each include a display panel including a display area where a plurality of pixels for displaying an image are provided and a non-display area which is disposed outside the display area and does not display an image, a gate driver that supplies a gate signal to the pixels, and a data driver that supplies data voltages to the pixels.

Moreover, the display devices each include a timing controller, which supplies signals for controlling the gate driver and the data driver, and a power management integrated circuit (PMIC) that generates a high level reference voltage EVDD and source voltages necessary for driving of the display panel and supplies the high level reference voltage and the source voltages to the display panel.

The timing controller senses a characteristic of the display panel before displaying an image. This is defined as an On-RF period. In the On-RF period, an internal operation performing signal VOE oscillates continuously for sensing the characteristic of the display panel. Also, in the On-RF period, a power management integrated circuit reset (PMIC_reset) signal generated by the PMIC is input to a power on reset (POR) input terminal of the timing controller. The PMIC reset signal maintains a high logic level irrespective of another signal after the On-RF period starts, and thus, the POR signal also maintains a high logic level after the On-RF period starts.

The high level reference voltage having a level equal to or more than a high level reference voltage sensing logic level is applied to the PMIC, and when the high level reference voltage has a high logic level or less, the PMIC supplies a high level reference voltage reset signal EVDD_RST having a low logic level. That is, the high level reference voltage reset signal may vary based on a variation of the high level reference voltage.

In the On-RF period, by using the high level reference voltage reset signal, the timing controller may inspect whether a sensing operation is completed. In this instance, when a logic level of the high level reference voltage is temporarily lowered and then increases, a logic level of the high level reference voltage reset signal is temporarily lowered and then increases.

At a time when a logic level of the high level reference voltage reset signal EVDD_RST is lowered, the timing controller determines that the sensing operation performed in the On-RF period is not completed. In the On-RF period, although the high level reference voltage reset signal is normalized to a high logic level, there is no variation of the POR signal, and thus, the timing controller cannot again start the sensing operation.

Figure 1:
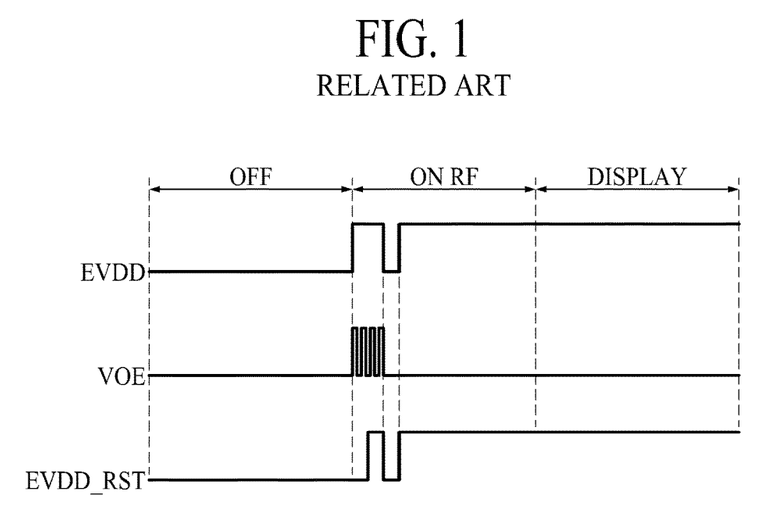
FIG. 1 is a waveform showing a high level reference voltage, an operation performing signal, and a high level reference voltage reset signal of the related art.

As shown in FIG. 1, at a time when a logic level of the high level reference voltage reset signal EVDD_RST is lowered in the On-RF period, a shift of a logic level of the operation performing signal VOE stops, and the operation performing signal VOE maintains a low logic level. In this instance, in a state where the sensing operation is not completed, the timing controller cannot again start the sensing operation. Also, since it is determined that the sensing is not completed, the On-RF period ends, and after entering a display period, a black state is maintained without supplying digital video data. In other words, the display can get stuck in a black screen state due to an error during a start-up initialization procedure and the display cannot reset itself. Therefore, even when a logic level of the high level reference voltage reset signal is temporarily lowered and then is normalized to an original level, the display is incapable of displaying an image because there is no internal reset function.

SUMMARY

Accordingly, the present disclosure is directed to provide a display panel driving unit, a driving method thereof, and a display device including the same that substantially obviate one or more problems due to limitations and disadvantages of the related art.

An aspect of the present disclosure is directed to provide a display panel driving unit, a driving method thereof, and a display device including the same, which autonomously restarts sensing when a logic level of a high level reference voltage reset signal is temporarily lowered and then is normalized.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display panel driving unit including a timing controller generating a power on reset signal for starting a sensing operation, a power management integrated circuit (PMIC) supplying a high level reference voltage reset signal to the timing controller and generating a control signal, and a control circuit receiving the high level reference voltage reset signal and the control signal from the PMIC to control a time when the power on reset signal is shifted to a high logic level or a low logic level, and when the high level reference voltage reset signal is shifted from a high logic level to a low logic level in a sensing period and then is again shifted to a high logic level, the control circuit performs control so that the power on reset signal is shifted from a high logic level to a low logic level at the same time and then is again shifted to a high logic level.

In another aspect of the present disclosure, there is provided a display device including a display panel, a plurality of gate lines and a plurality of data lines being arranged in the display panel, a gate driver respectively supplying gate signals to the plurality of gate lines, a data driver respectively supplying data voltages to the plurality of data lines, and a display panel driving unit supplying a gate driver control signal to the gate driver, supplying a data driver control signal to the data driver, and supplying a high level reference voltage and source voltages for driving of the display panel.

In another aspect of the present disclosure, there is provided a driving method of a display panel driving unit including executing a first period where an input voltage is input to a power management integrated circuit (PMIC), executing a second period where a timing controller maintains a power on reset signal at a low logic level, executing a third period where a high level reference voltage having a high logic level is input to the PMIC, and as a logic level of a control signal output from the PMIC is shifted, a control circuit pulls up the power on reset signal to a high logic level, and executing a fourth period where the PMIC outputs a high level reference voltage reset signal at a high logic level, and when the high level reference voltage reset signal is shifted from a high logic level to a low logic level in the fourth period and then is again shifted to a high logic level, the power on reset signal is shifted from a high logic level to a low logic level at the same time and then is again shifted to a high logic level.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings illustrating embodiments of the present disclosure are merely examples, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

When "comprise," "have" and "include" described in the present specification are used, another part may be added unless "only" is used. The terms of a singular form may include plural forms unless referred to the contrary.

In construing an element, the element is construed as including an error range although there is no explicit description.

In describing a position relationship, for example, when a position relation between two parts is described as "on," "over," "under" and "next," one or more other parts may be disposed between the two parts unless 'just' or 'direct' is used.

In describing a time relationship, for example, when the temporal order is described as "after," "subsequent," "next" and "before," a situation which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be performed independently from each other, or may be performed together in co-dependent relationship.

First, a cause of the problem described in the background will be described below in more detailed, and then, embodiments of the present disclosure will be described below in detail with reference to the accompanying drawings.

Figure 2:
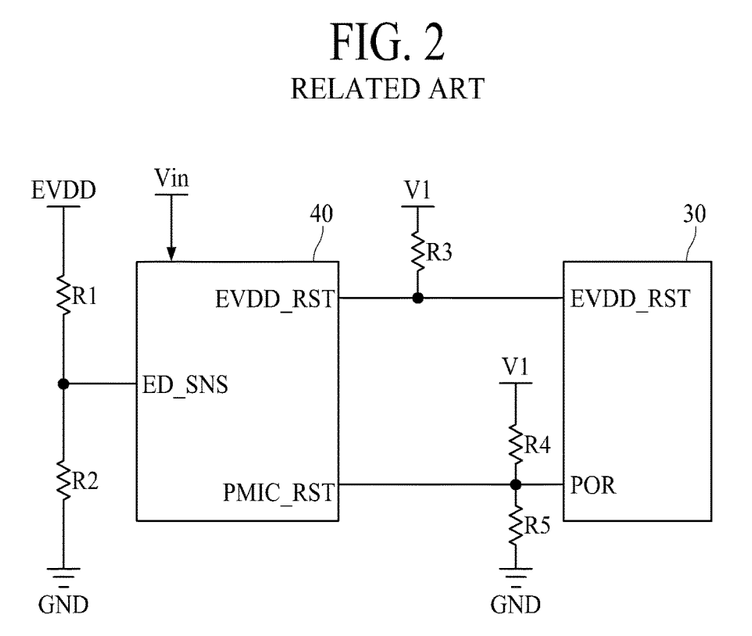
FIG. 2 is a circuit diagram illustrating a related art display panel driving unit.

FIG. 2 is a circuit diagram illustrating a related art display panel driving unit. The related art display panel driving unit includes a timing controller 30 and a power management integrated circuit (PMIC) 40.

The timing controller 30 is supplied with a high level reference voltage reset signal EVDD_RST from the PMIC 40. The high level reference voltage reset signal EVDD_RST is a signal for sensing a variation of a high level reference voltage EVDD and can control a level of the high level reference voltage reset signal EVDD_RST by using a third resistor R3 connected to a first power V1 line.

The timing controller 30 can be supplied with a PMIC reset signal PMIC_RST from the PMIC 40. The PMIC reset signal PMIC_RST is a signal for informing the timing controller that all powers are generated, after the PMIC 40 generates all of the powers. The timing controller generates a power on reset (POR) signal having the same waveform as that of the PMIC reset signal PMIC_RST. A level of the POR signal can be controlled by fourth and fifth resistors R4 and R5 connected to the first power V1 line. However, a time when the POR signal is pulled up from a low logic level to a high logic level is the same as a time when the PMIC reset signal PMIC_RST is pulled up.

The PMIC 40 receives an input power Vin. The input power Vin is a voltage which is used inside the PMIC 40 for generating various kinds of voltage supplied from the PMIC 40 to a display panel.

The PMIC 40 is supplied with the high level reference voltage EVDD through a high level reference voltage EVDD line. The high level reference voltage EVDD can be controlled to a certain level by first and second resistors R1 and R2, and then, can be supplied to a power input terminal ED_SNS of the PMIC 40.

The PMIC 40 generates the high level reference voltage reset signal EVDD_RST and the PMIC reset signal PMIC_RST by using the input voltage Vin and the high level reference voltage EVDD supplied thereto. The PMIC 40 supplied the high level reference voltage reset signal EVDD_RST and the PMIC reset signal PMIC_RST to the timing controller 30.

Figure 3:
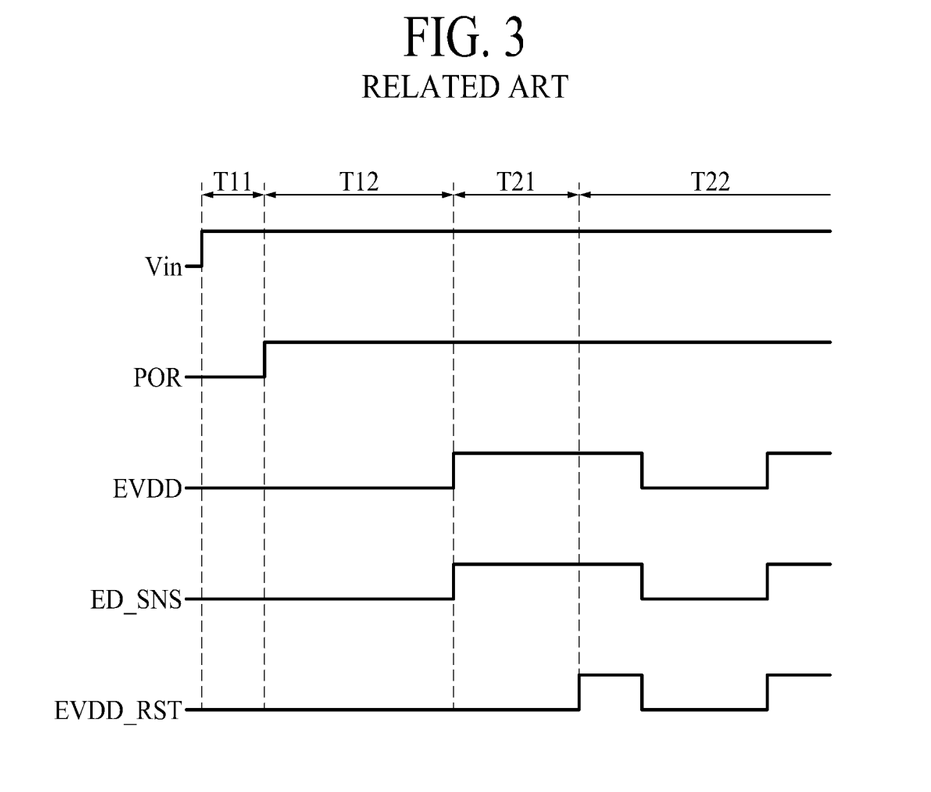
FIG. 3 is a period-based waveform diagram showing signals of a related art display panel driving unit.

FIG. 3 is a period-based waveform diagram showing signals of a related art display panel driving unit. First, in a first period T11, the input voltage Vin can be supplied, and thus, a logic level can be shifted to a high logic level. At this time, the other signals can maintain a low logic level. During the first period T11, the PMIC 40 can generate various kinds of voltages supplied to the display panel by using the input voltage Vin.

In a second period T12, the PMIC 40 can generate all powers, and then, can supply the PMIC reset signal PMIC_RST to the timing controller 30, thereby informing that all the powers are generated. The timing controller 30 can generate the POR signal having the same waveform as that of the PMIC reset signal PMIC_RST. Therefore, the POR signal can be pulled up to a high logic level, and then, can maintain a high logic level without being affected by the other signals.

In a first period T21, the high level reference voltage EVDD and a power input terminal ED_SNS can be pulled up to a high logic level. The On-RF period, which is a period where a state of each pixel provided in the display panel is sensed before displaying an image, can start from after the high level reference voltage EVDD is pulled up. The high level reference voltage EVDD can be supplied to the display panel, and thus, a feedback voltage or a current based on the high level reference voltage EVDD can be sensed and checked before the state of each pixel is displayed, whereby a uniform image can be displayed by supplying a data voltage corresponding to each pixel. The On-RF period can be continued for a certain time, for example, several seconds of about 3.8 sec In a second period T22, an increase in the high level reference voltage EVDD in the PMIC 40 can be sensed, and a high level reference voltage reset signal EVDD_RST can be pulled up. The PMIC 40 can supply the high level reference voltage reset signal EVDD_RST to the timing controller 30. When a certain time (i.e., a time of the above-described several seconds) elapses after the high level reference voltage reset signal EVDD_RST is pulled up, the timing controller 30 can determine that a sensing operation is completed in the On-RF period, and can start to display an image.

A problem does not occur in a normal situation, but a problem occurs when the high level reference voltage EVDD is temporarily lowered to a low logic level and then is normalized to a high logic level in the 2-second period T22 due to an external cause or an internal cause of the PMIC 40. This is because at a time when the high level reference voltage EVDD is lowered to a low logic level, the high level reference voltage reset signal EVDD_RST is also lowered to a low logic level. At this time, the timing controller 30 can determine that the sensing operation is not completed, and can allow an image not to be displayed.

Moreover, even after the high level reference voltage EVDD and the high level reference voltage reset signal EVDD_RST are normalized, the timing controller 30 cannot restart the sensing operation in the On-RF period. This is because irrespective of a variation of each of the high level reference voltage EVDD and the high level reference voltage reset signal EVDD_RST, the POR signal is maintained at a high logic level after the 1-second period T12. Only when the POR signal is shifted from a low logic level to a high logic level, the timing controller 30 can restart an On-RF sensing operation. In this regard, when the high level reference voltage EVDD is temporarily lowered to a low logic level and then is normalized to a high logic level, the timing controller 30 cannot autonomously restart the sensing operation.

Figure 4:
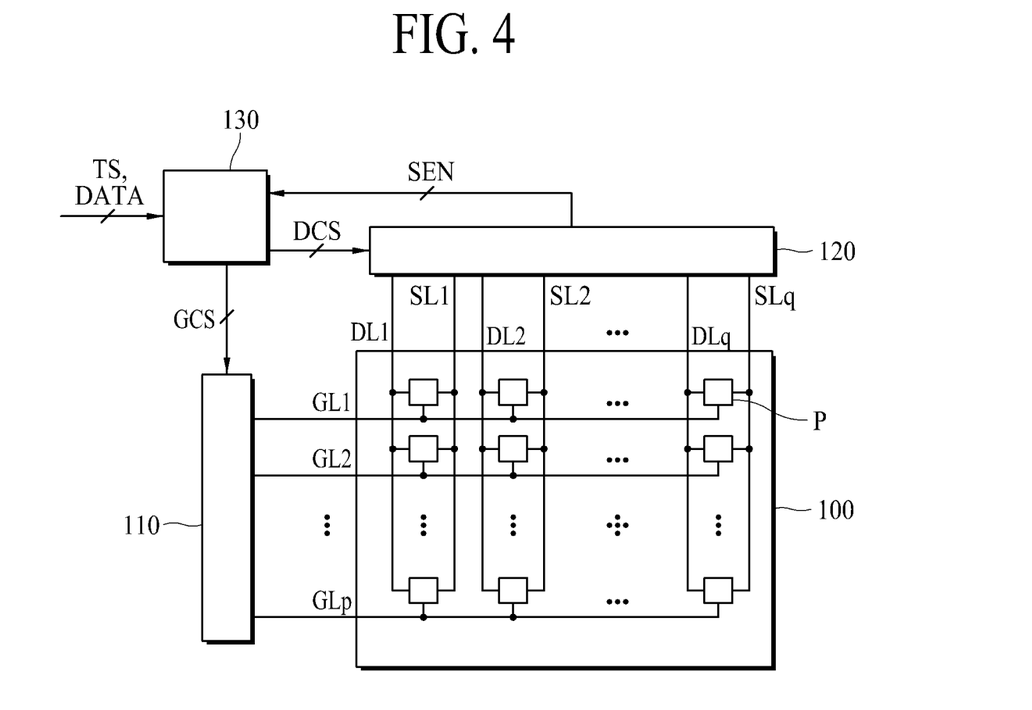
FIG. 4 is a block diagram of a display device according to an embodiment of the present disclosure.
Figure 5:
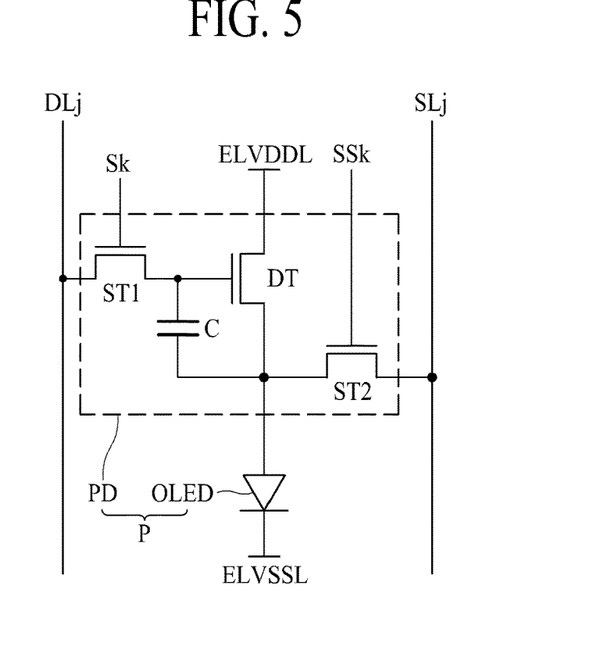
FIG. 5 is a circuit diagram of a pixel according to an embodiment of the present disclosure.

FIG. 4 is a block diagram of a display device according to an embodiment of the present disclosure. FIG. 5 is a circuit diagram of a pixel P according to an embodiment of the present disclosure.

Referring to FIGS. 4 and 5, the display device according to an embodiment of the present disclosure can include a first display panel 100, a gate driver 110, a data driver 120, a timing controller (T-CON) 130, a scan driver, and a sensing driver.

The display panel 100 can include a display area and a non-display area provided near the display area. The display area can be an area where a plurality of pixels P are provided to display an image. A plurality of gate line GL1 to GLp (where p is a positive integer equal to or more than two), a plurality of data lines DL1 to DLq (where q is a positive integer equal to or more than two), and a plurality of sensing lines SL1 to SL1 can be provided in the display panel 100. The plurality of data lines DL1 to DLq and the plurality of sensing lines SL1 to SL1 can intersect the plurality of gate lines GL1 to GLp. The plurality of data lines DL1 to DLq and the plurality of sensing lines SL1 to SL1 can be parallel to each other. The display panel 100 can include a lower substrate, where the pixels P are provided, and an upper substrate that performs an encapsulation function.

Each of the pixels P can be connected to one corresponding gate line of the gate lines GL1 to GLp, one corresponding data line of the data lines DL1 to DLq, and one corresponding data line of the sensing lines SL1 to SLq. The display device according to an embodiment of the present disclosure can be applied to a display device that senses a characteristic of each of the pixels P provided in the display panel. Hereinafter, therefore, a structure of each pixel P will be described on the assumption that the display device according to an embodiment of the present is an organic light emitting display device.

Each of the pixels P, as in FIG. 5, can include an organic light emitting diode OLED and a pixel driver PD that supplies a current to the organic light emitting diode OLED. In FIG. 5, for convenience of description, only a pixel P connected to a jth (where j is a positive integer satisfying 1≤j≤q) data line DLj, a jth sensing line SLj, a kth (where k is a positive integer satisfying 1≤k≤p) scan line Sk, and a kth sensing signal line SSk is illustrated.

Referring to FIG. 5, the pixels P can each include the organic light emitting diode OLED and the pixel driver PD that supplies a current to the organic light emitting diode OLED and the jth sensing lines SLj.

The organic light emitting diode OLED can emit light with a current supplied through a driving transistor DT. An anode electrode of the organic light emitting diode OLED can be connected to a source electrode of the driving transistor DT, and a cathode electrode can be connected to a low level voltage line ELVSSL through which a low level voltage lower than a high level voltage is supplied.

The organic light emitting diode OLED can include the anode electrode, a hole transporting layer, an organic light emitting layer, an electron transporting layer, and the cathode electrode. In the organic light emitting diode OLED, when a voltage is applied to the anode electrode and the cathode electrode, a hole and an electron can respectively move to the hole transporting layer and the electron transporting layer and can be combined with each other to emit light in the organic light emitting layer.

The pixel driver PD can include the driving transistor DT, a first transistor ST1 controlled by a scan signal of the scan line Sk, a second transistor ST2 controlled by a sensing signal of the sensing signal line SSk, and a capacitor C. In a display mode, when the scan signal is supplied through the scan line Sk connected to the pixel P, the pixel driver PD can be supplied with a data voltage VDATA of the data line DLj connected to the pixel P, and a current of the driving transistor DT based on the data voltage VDATA can be supplied to the organic light emitting diode OLED. In a sensing mode, when the scan signal is supplied through the scan line Sk connected to the pixel P, the pixel driver PD can be supplied with a sensing voltage of the data line DLj connected to the pixel P, and a current of the driving transistor DT can flow to the sensing line SLj connected to the pixel P.

The driving transistor DT can be provided between the high level voltage line ELVDDL and the organic light emitting diode OLED. The driving transistor DT can control a current flowing from the high level voltage line ELVDDL to the organic light emitting diode OLED, based on a voltage difference between a gate electrode and a source electrode of the driving transistor DT. The gate electrode of the driving transistor DT can be connected to a first electrode of the first transistor ST1, the source electrode can be connected to the anode electrode of the organic light emitting diode OLED, and a drain electrode can be connected to the high level voltage line ELVDDL through which the high level voltage is supplied.

The first transistor ST1 can be turned on by a kth scan signal of the kth scan line Sk and can supply a voltage of the jth data line DLj to the gate electrode of the driving transistor DT. A gate electrode of the first transistor ST1 can be connected to the kth scan line Sk, the first electrode can be connected to the gate electrode of the driving transistor DT, and a second electrode can be connected to the jth data line DLj. The first transistor ST1 can be referred to as a scan transistor.

The second transistor ST2 can be turned on by a kth sensing signal of the kth sensing signal line SSk and can connect the jth sensing line SLj to the source electrode of the driving transistor DT. A gate electrode of the second transistor ST2 can be connected to the kth sensing signal line SSk, a first electrode can be connected to the jth sensing line SLj, and a second electrode can be connected to the source electrode of the driving transistor DT. The second transistor ST2 can be referred to as a sensing transistor.

The capacitor C can be provided between the gate electrode and the source electrode of the driving transistor DT. The capacitor C can store a difference voltage between a gate voltage and a source voltage of the driving transistor DT.

In FIG. 5, an example where the driving transistor DT and the first and second transistors ST1 and ST2 are each formed of an N-type metal oxide semiconductor field effect transistor (MOSFET) has been described, but the present disclosure is not limited thereto. The driving transistor DT and the first and second transistors ST1 and ST2 can each be formed of a P-type MOSFET. Also, the first electrode can be a source electrode, and the second electrode can be a drain electrode. However, the present embodiment is not limited thereto. In other embodiments, the first electrode can be a drain electrode, and the second electrode can be a source electrode.

In the display mode, when the scan signal is supplied to the kth scan line Sk, the data voltage VDATA of the jth data line Dj can be supplied to the gate electrode of the driving transistor DT, and when the sensing signal is supplied to the kth sensing signal line SSk, an initialization voltage of the jth sensing line SLj can be supplied to the source electrode of the driving transistor DT. Therefore, in the display mode, a current of the driving transistor DT which flows according to a voltage difference between a voltage at the gate electrode and a voltage at the source electrode of the driving transistor DT can be supplied to the organic light emitting diode OLED, and the organic light emitting diode OLED can emit light with the current of the driving transistor DT. In this instance, the data voltage VDATA can be a voltage generated by compensating for a threshold voltage and an electron mobility of the driving transistor DT, and thus, the current of the driving transistor DT does not depend on the threshold voltage and electron mobility of the driving transistor DT.

In the sensing mode, when the scan signal is supplied to the kth scan line Sk, a sensing voltage of the jth data line Dj can be supplied to the gate electrode of the driving transistor DT, and when the sensing signal is supplied to the kth sensing signal line SSk, the initialization voltage of the jth sensing line SLj can be supplied to the source electrode of the driving transistor DT. Also, when the sensing signal is supplied to the kth sensing signal line SSk, the second transistor ST2 can be turned on, and thus, the current of the driving transistor DT which flows according to the voltage difference between the voltage at the gate electrode and the voltage at the source electrode of the driving transistor DT can flow to the jth sensing line SLj.

The gate driver 110 can be supplied with a gate control signal GCS from the timing controller 130 and can generate gate signals according to the gate driving control signal GCS to supply the gate signals to the gate lines GL1 to GLp.

The data driver 120 can include a plurality of source drive ICs. The source drive ICs can be respectively mounted on a plurality of flexible films. Each of the flexible films can be provided as a chip on film (COF). The COF can include a base film, such as polyimide, and a plurality of conductive lead lines provided on the base film. The flexible films can be bent or curved. The flexible films can each be attached on a lower substrate of the display panel 100 and a control printed circuit board (C-PCB). Particularly, each of the flexible films can be attached on the lower substrate in a tape automated bonding (TAB) type by using an anisotropic conductive film (ACF), and thus, the source drive ICs can be connected to the data lines Dl1 to DLq.

The timing controller 130 can be supplied with digital video data DATA and a timing signal TS from an external system board. The timing signal TS and the digital video data DATA can be input to an input terminal of the timing controller 130, based on a predetermined protocol. The timing signal TS can include a vertical sync signal Vsync, a horizontal sync signal Hsync, a data enable signal DE, and a dot clock DCLK. The timing controller 130 can be supplied with sensing data SEN from the data driver 120. The timing controller 130 can compensate for the digital video data DATA, based on the sensing data SEN.

The timing controller 130 can generate timing control signals for controlling the operation timings of the gate driver 110, the data driver 120, the scan driver, and the sensing driver. The timing control signals can include a gate timing control signal GCS for controlling the operation timing of the gate driver 110, a data timing control signal DCS of the operation timing of the data driver 120, a scan timing control signal for controlling the operation timing of the scan driver, and a sensing timing control signal for controlling the operation timing of the sensing driver.

The timing controller 130 can operate the data driver 120, the scan driver, and the sensing driver in one mode of the display mode and the sensing mode according to a mode signal. The display mode can be a mode in which the pixels P of the display panel 100 display an image, and the sensing mode can be a mode in which a current of a driving transistor DT of each of the pixels P of the display panel 100 is sensed. When a waveform of the scan signal and a waveform of the sensing signal supplied to each of the pixels P are changed in each of the display mode and the sensing mode, the data timing control signal DCS, the scan timing control signal, and the sensing timing control signal can also be changed in each of the display mode and the sensing mode. Therefore, the timing controller 130 can generate the data timing control signal DCS, the scan timing control signal, and the sensing timing control signal according to one mode of the display mode and the sensing mode.

The timing controller 130 can output the gate timing control signal GCS to the gate driver 110. The timing controller 130 can output compensation digital video data and the data timing control signal DCS to the data driver 120. The timing controller 130 can output the scan timing control signal to the scan driver. The timing controller 130 can output the sensing timing control signal to the sensing driver.

Moreover, the timing controller 130 can generate a mode signal for executing one mode of the display mode and the sensing mode for driving the data driver 120, the scan driver, and the sensing driver. The timing controller 130 can operate the data driver 120, the scan driver, and the sensing driver in one mode of the display mode and the sensing mode according to the mode signal.

Figure 6:
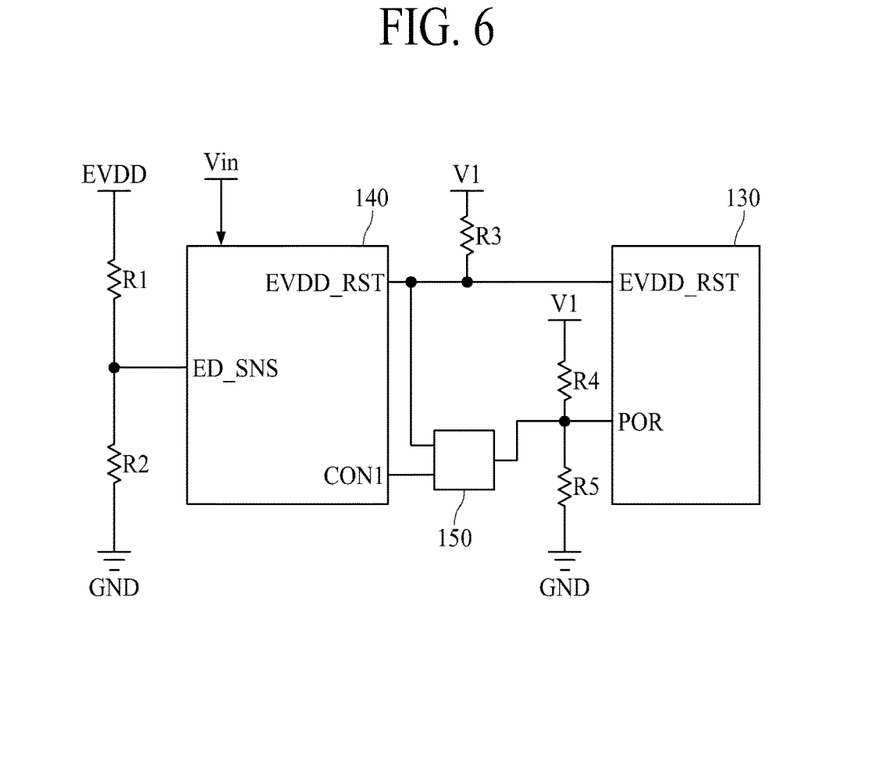
FIG. 6 is a circuit diagram illustrating a display panel driving unit according to an embodiment of the present disclosure.

FIG. 6 is a circuit diagram illustrating a display panel driving unit according to an embodiment of the present disclosure. The display panel driving unit according to an embodiment of the present disclosure includes a timing controller 130, a PMIC 140, and a control circuit 150.

The timing controller 130 can generate a power on reset signal POR for starting a sensing operation. As described above, the timing controller 130 can perform several functions, and examples of the improved features of the present disclosure include a pull-up timing and a pull-down timing of the power on reset signal POR. Therefore, descriptions of the other signals generated by the timing controller 130 are omitted.

Unlike the related art, the power on reset signal POR according to an embodiment of the present disclosure may not be generated directly from the PMIC reset signal PMIC_RST and can be generated based on a high level reference voltage reset signal EVDD_RST and a first control signal CON1, which are generated by the PMIC 140, and an output value generated by the control circuit 150.

The PMIC 140 can generate a high level reference voltage EVDD, the high level reference voltage reset signal EVDD_RST for sensing a variation of the high level reference voltage EVDD, and the first control signal CON1 for generating the POR signal. The PMIC 140 can supply the high level reference voltage reset signal EVDD_RST to the timing controller 130. Also, the PMIC 140 can supply the high level reference voltage reset signal EVDD_RST and the first control signal CON1 to the control circuit 150.

The control circuit 150 can be supplied with the high level reference voltage reset signal EVDD_RST and the first control signal CON1 from the PMIC 140. The control circuit 150 can control a time when the power on reset signal POR of the timing controller 130 is shifted to a high logic level or a low logic level.

In more detail, when the high level reference voltage reset signal EVDD_RST is temporarily lowered and then is normalized in a sensing period where an On-RF sensing operation is performed, namely, when the high level reference voltage reset signal EVDD_RST is shifted from a high logic level to a low logic level and then is again shifted to a high logic level, the control circuit 150 can perform control so that the power on reset signal POR is shifted from a high logic level to a low logic level at the same time and then is again shifted to a high logic level.

When the high level reference voltage reset signal EVDD_RST is temporarily lowered in the sensing period where the On-RF sensing operation is performed, the timing controller 130 can stop the sensing operation. Also, the timing controller 130 can continuously maintain a state where the On-RF sensing operation is not completed. As described above, if the power on reset signal POR is not shifted, the timing controller 130 cannot again start the sensing operation, and moreover, cannot display an image.

At this time, when the power on reset signal POR is pulled up, namely, when the power on reset signal POR is shifted from a low logic level to a high logic level, the timing controller 130 can start the sensing operation in the On-RF period. Also, when the high level reference voltage EVDD and the high level reference voltage reset signal EVDD_RST are temporarily lowered and then are again normalized, the timing controller 130 can restart the sensing operation in the On-RF period after the power on reset signal POR is pulled up, and immediately, can restart the sensing operation without previously sensed information being lost.

That is, when the high level reference voltage EVDD and the high level reference voltage reset signal EVDD_RST are temporarily lowered and then are again normalized, the display panel driving unit according to an embodiment of the present disclosure can temporarily lower the power on reset signal POR at the same time and then can pull up the power on reset signal POR, thereby enabling the sensing operation to be performed in the On-RF period. Also, by using the power on reset signal POR, the display panel driving unit according to an embodiment of the present disclosure can control the timing controller 130 to again start the sensing operation and immediately restart the sensing operation without previously sensed information being lost.

Figure 7:
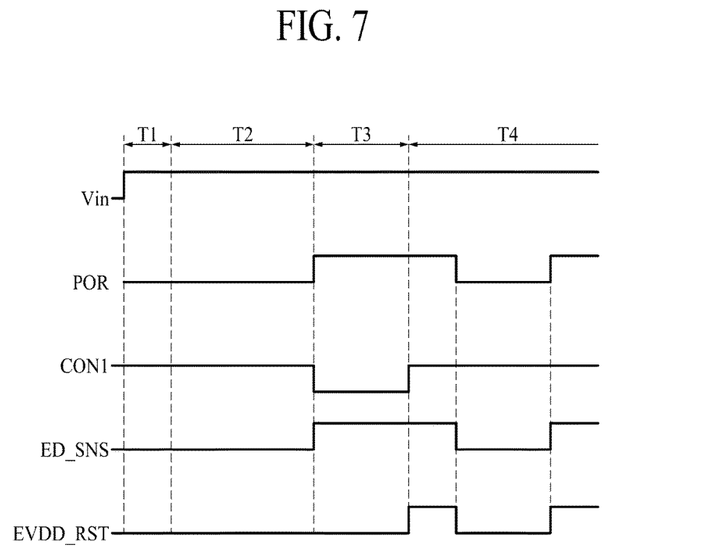
FIG. 7 is a period-based waveform diagram showing signals of a display panel driving unit according to an embodiment of the present disclosure.

FIG. 7 is a period-based waveform diagram showing signals of a display panel driving unit according to an embodiment of the present disclosure.

In a first period T1, the input voltage Vin can be input to the PMIC 140. Also, the first control signal CON1 can maintain a high logic level from the first period T1. The other signals can maintain a low logic level in the first period T1. In the first period T1, the PMIC 140 can generate source voltages applied to driving of the display panel.

In a second period T2, the PMIC 140 can complete generation of the source voltages, and the PMIC reset signal PMIC_RST can be shifted to a high logic level. However, as described above, the timing controller 130 according to an embodiment of the present disclosure may not use the PMIC reset signal PMIC_RST for generating the power on reset signal POR. In an embodiment of the present disclosure, the power on reset signal POR can be used to generate the high level reference voltage reset signal EVDD_RST and the first control signal CON1, and the high level reference voltage reset signal EVDD_RST or the first control signal CON1 may not be shifted in the first period T1 and the second period T2. Accordingly, the timing controller 130 can maintain the power on reset signal POR having a low logic level until the second period T2.

At a time when a third period T3 starts, the PMIC 140 can receive the high level reference voltage EVDD having a high logic level. Also, the first control signal CON1 output from the PMIC 140 can be shifted from a high logic level to a low logic level. Simultaneously, the control circuit 150 can pull up the power on reset signal POR of the timing controller 130 to a high logic level. At this time, the timing controller 130 can start to perform the sensing operation in the On-RF period.

In a fourth period T4, the high level reference voltage EVDD having a high logic level can be sensed, and thus, the high level reference voltage reset signal EVDD_RST can also be shifted to a high logic level. The PMIC 140 can output the high level reference voltage reset signal EVDD_RST at a high logic level. When the high level reference voltage reset signal EVDD_RST is maintained at a high logic level for a certain time, the timing controller 130 can complete the sensing operation in the On-RF period and can start to display an image.

As described above, when the high level reference voltage EVDD is temporarily lowered and then is normalized in the fourth period T4, namely, when the high level reference voltage EVDD is temporarily shifted to a low logic level and then returns to a high logic level, the high level reference voltage reset signal EVDD_RST can also be temporarily lowered and then normalized. In a driving method of the display panel driving unit according to an embodiment of the present disclosure, the high level reference voltage reset signal EVDD_RST can be shifted from a high logic level to a low logic level in the fourth period T4 and then is again shifted to a high logic level, the control circuit 150 can perform control so that the power on reset signal POR is shifted from a high logic level to a low logic level at the same time and then is again shifted to a high logic level.

When the high level reference voltage EVDD is temporarily shifted and then is normalized, the high level reference voltage reset signal EVDD_RST can be shifted and then normalized, and at a time when the high level reference voltage reset signal EVDD_RST is shifted, the timing controller 130 can stop the sensing operation in the On-RF period. At this time, the power on reset signal POR can be shifted from a high logic level to a low logic level and then is again shifted to a high logic level, thereby enabling the timing controller 130 to start the sensing operation in the On-RF period. Accordingly, when the high level reference voltage EVDD is temporarily shifted, the timing controller 130 can autonomously restart the On-RF sensing operation and can be normally driven.

For example, the control circuit 150 can perform control so that a time when the power on reset signal POR is shifted to a high logic level or a low logic level is the same as a time when the high level reference voltage EVDD is shifted to a high logic level or a low logic level. That is, when the high level reference voltage EVDD has a high logic level, the power on reset signal POR can also have a high logic level, and when the high level reference voltage EVDD has a low logic level, the power on reset signal POR can also have a low logic level.

While the high level reference voltage EVDD has a low logic level, it is unable to perform the sensing operation, and thus, at this time, the power on reset signal POR can be pulled down, thereby decreasing consumption power. Also, while the high level reference voltage EVDD is normally supplied at a high logic level, the sensing operation can be normally performed, and thus, by pulling down the power on reset signal POR from a time when the high level reference voltage EVDD is normalized to a high logic level, the timing controller 130 can normally perform the On-RF sensing operation again, thereby enabling the On-RF sensing operation to be quickly completed.

Figure 8:
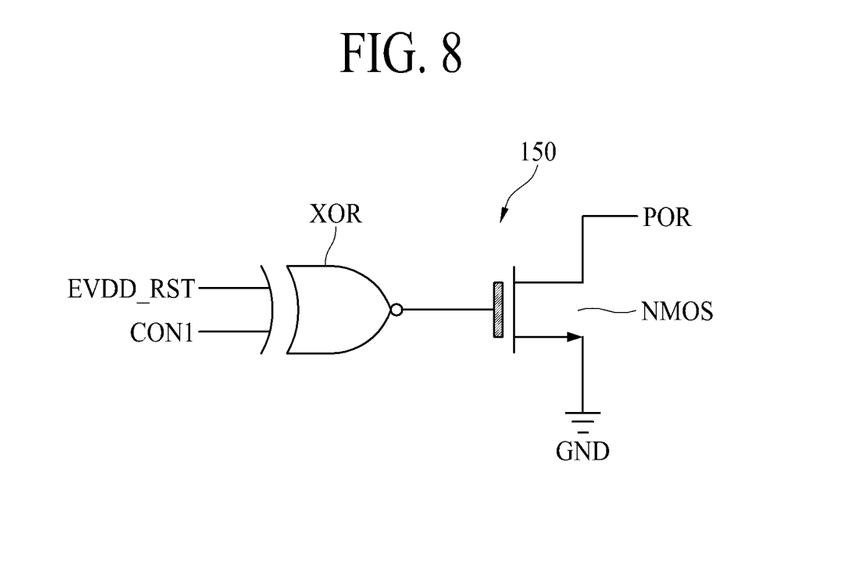
FIGS. 8 and 9 are circuit diagrams illustrating in detail a control circuit according to an embodiment of the present disclosure.
Figure 9:
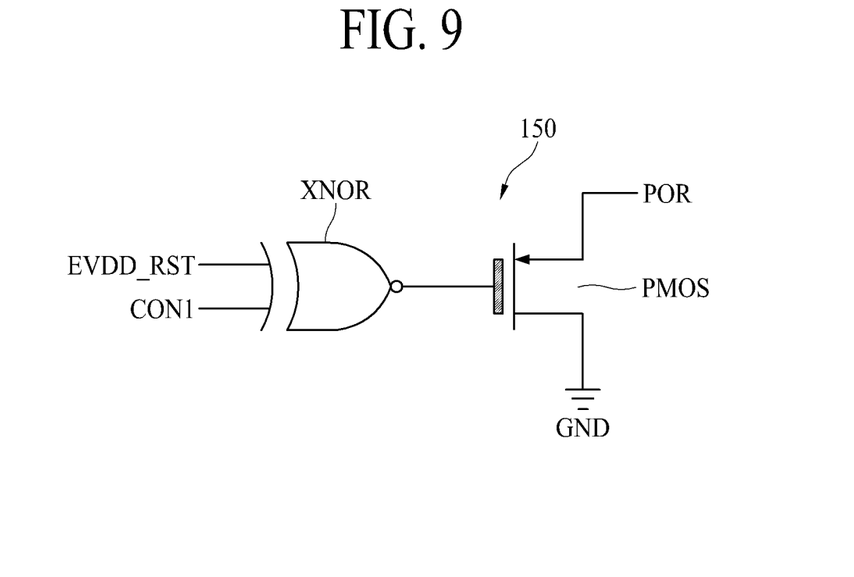

FIGS. 8 and 9 are circuit diagrams illustrating in detail a control circuit 150 according to an embodiment of the present disclosure.

The control circuit 150 can include a logic gate XOR (or XNOR), which is supplied with a high level reference voltage reset signal EVDD_RST and a first control signal CON1 to output one output value, and one switching element NMOS (or PMOS) that is supplied with the output value and is turned on/off.

Thus, when the control circuit 150 is configured with one logic gate and one switching element, when at least one of the high level reference voltage reset signal EVDD_RST and the first control signal CON1 is shifted, the control circuit 150 can immediately turn on/off the switching element according to the shift. Also, as the switching element is turned on/off, a logic level of a power on reset signal POR connected to the other end of the switching element can be immediately shifted, and thus, the control circuit 150 can pull up the power on reset signal POR at a desired time.

As in FIG. 8, when an XOR gate is used as the logic gate XOR, an NMOS transistor can be used as the switching element NMOS. When two input values input to the XOR gate XOR have different logic levels, the XOR gate XOR can output a high logic level, and when the two input values have the same logic level, the XOR gate XOR can output a low logic level.

In the first period T1 and the second period T2, the high level reference voltage reset signal EVDD_RST can have a low logic level, and the first control signal CON1 can have a high logic level, whereby the XOR gate XOR can output a high logic level. When the XOR gate XOR outputs a high logic level, the NMOS transistor NMOS can be turned on to connect a ground voltage to a POR signal terminal, thereby shifting the power on reset signal POR to a low logic level.

In the third period T3, the first control signal CON1 can be shifted to a low logic level, the XOR gate XOR can output a signal having a low logic level. At this time, the NMOS transistor NMOS can be turned off to connect a first voltage V1 to the POR signal terminal, thereby shifting the power on reset signal POR to a high logic level.

In the fourth period T4, the high level reference voltage reset signal EVDD_RST can be shifted to a high logic level, and the first control signal CON1 can be shifted to a high logic level, whereby the XOR gate XOR can output a signal having a low logic level. At this time, the NMOS transistor NMOS can be turned off to connect a first voltage V1 to the POR signal terminal, thereby shifting the power on reset signal POR to a high logic level.

At this time, in the fourth period T4, the XOR gate XOR can output a signal having a high logic level at a time when the high level reference voltage reset signal EVDD_RST is shifted to a low logic level. At this time, the NMOS transistor NMOS can be turned on to connect the ground voltage to the POR signal terminal, thereby shifting the power on reset signal POR to a low logic level.

Subsequently, when the high level reference voltage reset signal EVDD_RST is normalized to a high logic level, the XOR gate XOR can output a signal having a low logic level. At this time, the NMOS transistor NMOS can be turned off to connect the first voltage V1 to the POR signal terminal, thereby shifting the power on reset signal POR to a high logic level. Such an operation can correspond to the pull-up of the power on reset signal POR, thereby enabling the timing controller 130 to perform the On-RF sensing operation again.

As in FIG. 9, when an XNOR gate is used as the logic gate XNOR, a PMOS transistor can be used as the switching element PMOS. When two input values input to the XNOR gate XNOR have different logic levels, the XNOR gate NXOR can output a low logic level, and when the two input values have the same logic level, the XNOR gate XNOR can output a high logic level. That is, an output value of XNOR gate XNOR can have a result value obtained by performing an XNOR operation. In this instance, a logic level of a voltage applied to each of a source and a drain of PMOS transistor PMOS is opposite to a logic level of a voltage applied to each of a source and a drain of NMOS transistor NMOS, and thus, in FIGS. 8 and 9, the power on reset signal POR can be identically controlled.

Figure 10:
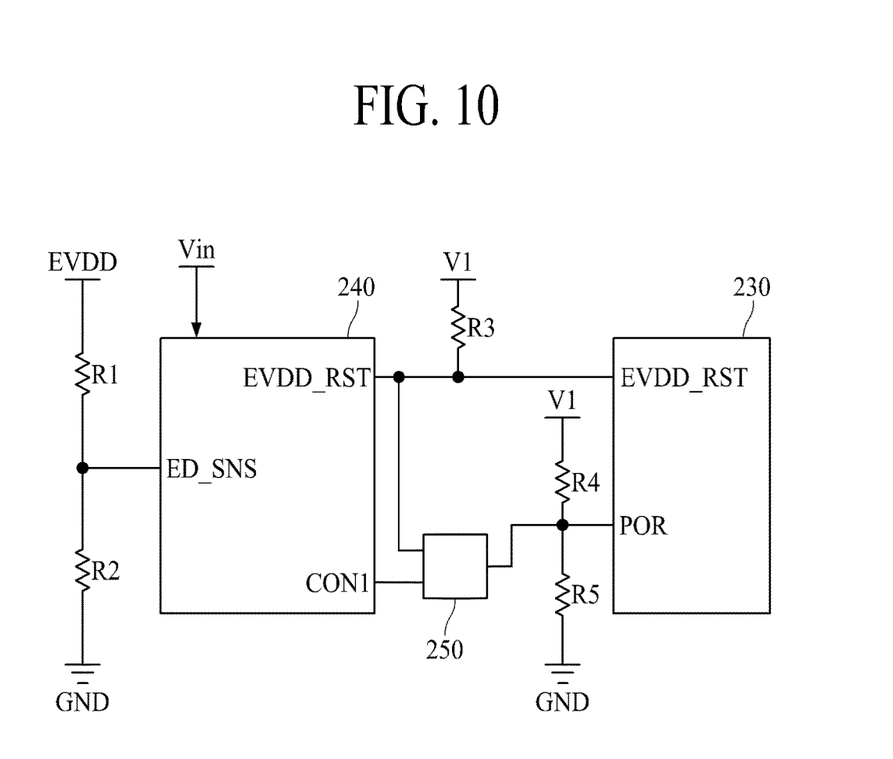
FIG. 10 is a circuit diagram illustrating a display panel driving unit according to another embodiment of the present disclosure.

FIG. 10 is a circuit diagram illustrating a display panel driving unit according to another embodiment of the present disclosure. The display panel driving unit according to another embodiment of the present disclosure includes a timing controller 230, a PMIC 240, and a control circuit 250.

A configuration and a function of the timing controller 230 included in the display panel driving unit according to another embodiment of the present disclosure is substantially the same as those of the timing controller 130 included in the display panel driving unit according to an embodiment of the present disclosure, and thus, their detailed descriptions are omitted.

The PMIC 240 can generate a high level reference voltage EVDD, a high level reference voltage reset signal EVDD_RST for sensing a variation of the high level reference voltage EVDD, and a second control signal CON2 for generating a POR signal. The PMIC 240 can supply the high level reference voltage reset signal EVDD_RST to a timing controller 230. Also, the PMIC 240 can supply the high level reference voltage reset signal EVDD_RST and the second control signal CON2 to a control circuit 250.

The control circuit 250 can be supplied with the high level reference voltage reset signal EVDD_RST and the second control signal CON2 from the PMIC 240. The control circuit 250 can control a time when the power on reset signal POR of the timing controller 230 is shifted to a high logic level or a low logic level.

Figure 11:
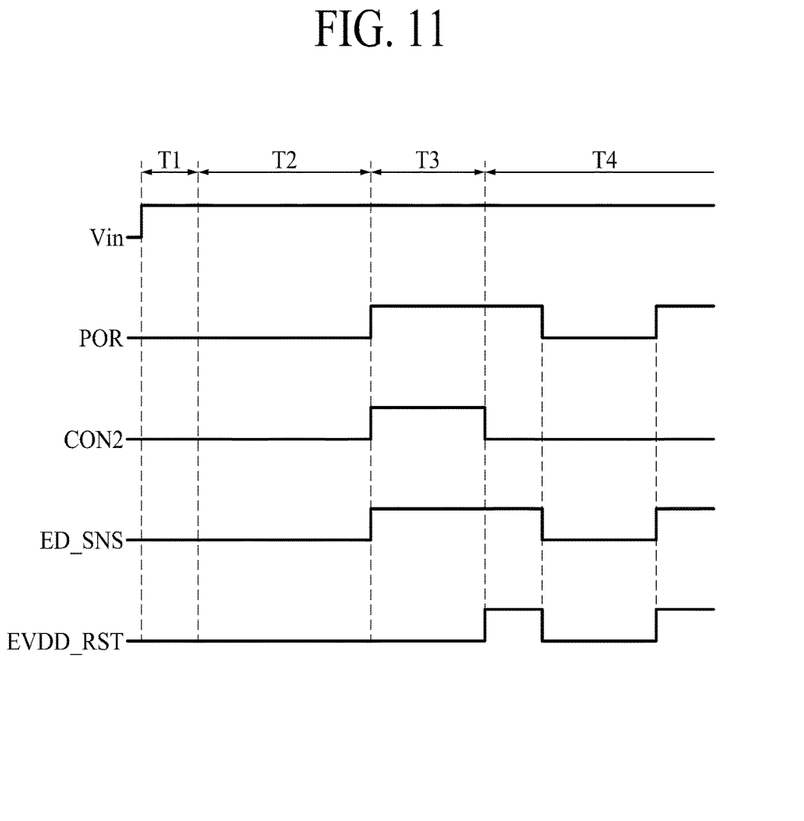
FIG. 11 is a period-based waveform diagram showing signals of a display panel driving unit according to another embodiment of the present disclosure.

FIG. 11 is a period-based waveform diagram showing signals of the display panel driving unit according to another embodiment of the present disclosure.

Except for the second control signal CON2, the signals of the display panel driving unit according to another embodiment of the present disclosure are the same as those of the display panel driving unit according to an embodiment of the present disclosure, and thus, their detailed descriptions are omitted.

The second control signal CON2 can have a logic level opposite to that of the first control signal CON1. That is, the second control signal CON2 can have a low logic level in a first period T1 and a second period T2, have a high logic level in a third period T3, and have a low logic level in a fourth period T4.

Although the second control signal CON2 is shifted to a logic level opposite to that of the first control signal CON1, when the control circuit 150 is differently configured, the second control signal CON2 can have the same function as that of the first control signal CON1. That is, when a logic gate and a switching element are switched in their disposed positions, a result value of a power on reset signal POR can be the same as that when the first control signal CON1 is supplied.

Figure 12:
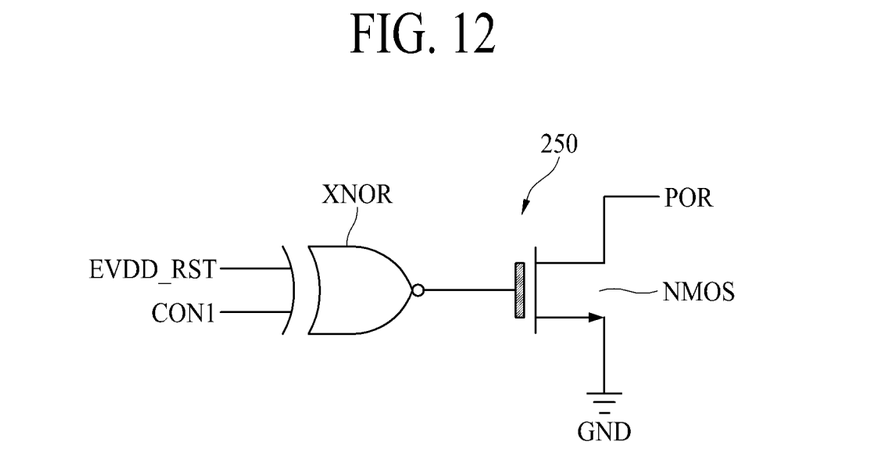
FIGS. 12 and 13 are circuit diagrams illustrating in detail a control circuit according to an embodiment of the present disclosure.
Figure 13:
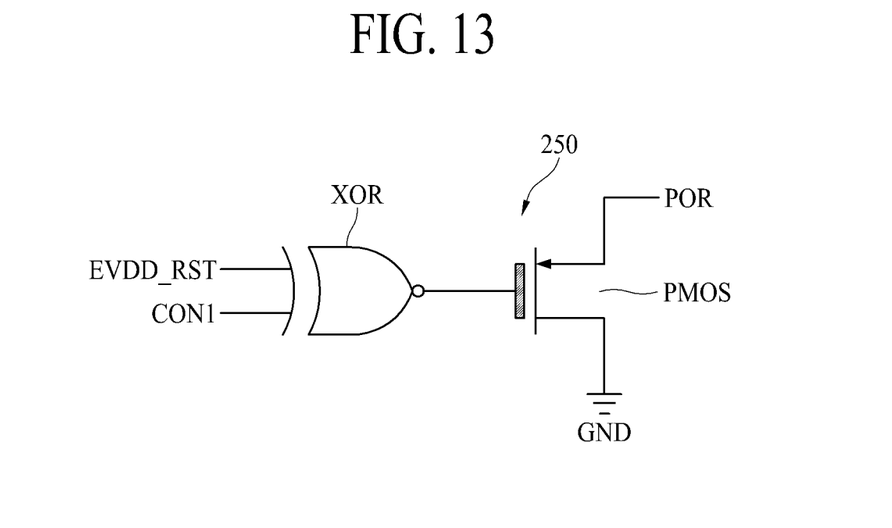

FIGS. 12 and 13 are circuit diagrams illustrating in detail a control circuit 250 according to an embodiment of the present disclosure.

In another embodiment of the present disclosure, the second control signal CON2 which has a logic level opposite to that of the first control signal CON1 in all periods can be an input value of the logic gate, and thus, if the kind of the logic gate or the switching element is changed, the same power on reset signal POR can be generated.

As in FIG. 12, when an XNOR gate is used as the logic gate XNOR, an NMOS transistor can be used as the switching element NMOS. Further, as in FIG. 13, when an XOR gate is used as the logic gate XOR, a PMOS transistor can be used as the switching element PMOS.

To describe embodiments of the present disclosure, in order to generate the same power on reset signal POR, the XOR gate XOR can be used, or the XNOR gate XNOR can be used. That is, the logic gate can be selectively used based on the kind of the control signal CON1 (CON2) and whether the switching element is the NMOS transistor or the PMOS transistor. Therefore, the control signals generated by the PMIC 140 (240) can use signals each having a logic level which is shifted in the third period T3, and thus, a degree of freedom of design is enhanced. Also, the logic gate can be used based on the kind of the switching element, and thus, a degree of freedom of design is enhanced.

Moreover, in the embodiments of the present disclosure, the switching element of the control circuit 150 can be a field effect transistor (NMOS or PMOS) including a gate electrode which receives an output value of a logic gate. When the field effect transistor (NMOS or PMOS) is used as a switching element, the switching element can be immediately turned on/off according to the output value of the logic gate applied to the gate electrode of the field effect transistor (NMOS or PMOS). Therefore, when a logic level of the output value of the logic gate is shifted due to a variation of the high level reference voltage reset signal EVDD_RST or the control signal CON1 or CON2 applied to the logic gate, a logic level of the power on reset signal POR can be immediately shifted based on the shift. Accordingly, the timing controller 130 can quickly restart the sensing operation based on the shift (particularly, pull-up) of the logic level of the power on reset signal POR.

In the display device including the display panel driving unit according to an embodiment of the present disclosure, the high level reference voltage varies due to an external cause or an internally temporary error of the display device, and for this reason, when the high level reference voltage reset signal is shifted from a high logic level to a low logic level and then is restored to a high logic level, the display device can restart the On-RF sensing operation of sensing the characteristic of the display panel before displaying an image. Therefore, according to the embodiments of the present disclosure, when a logic level of the high level reference voltage reset signal is temporarily reduced, the display device can autonomously restart the On-RF sensing operation, thereby allowing the timing controller to complete the sensing operation. As a result, the display device can display an image after the sensing operation completes normally, thereby preventing an occurrence of no display, in which a black state is maintained as-is without displaying an image. In other words, the display panel driving unit can restart a pixel sensing operation during a pixel compensation initialization phase, even when a fault occurs during the initialization phase which interrupts the sensing operation.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:
1. A display panel driving unit comprising:
a timing controller configured to supply a power on reset signal for starting a sensing operation for pixel compensation during a sensing period before displaying an image;
a power management integrated circuit (PMIC) configured to supply a high level reference voltage reset signal to the timing controller, and generate a control signal; and
a control circuit connected between the PMIC and the timing controller, and configured to:
receive the high level reference voltage reset signal and the control signal from the PMIC,
in response to the high level reference voltage reset signal transitioning from a high logic level to a low logic level and then from the low logic level back to the high logic level, shift the power on reset signal to transition from a high logic level to a low logic level and then from the low logic level back to the high logic level, in order to follow the high level reference voltage reset signal for restarting the sensing operation, and
supply the power on reset signal to the timing controller,
wherein the timing controller is connected a display panel comprising a plurality of pixels, and
wherein both the high level reference voltage reset signal and the power on reset signal transition from the high logic level to the low logic level and then from the low logic level back to the high logic level, at the same time while the display panel is in a black screen state.

2. The display panel driving unit of claim 1, wherein both the high level reference voltage reset signal and the power on reset signal transition from the high logic level to the low logic level and then from the low logic level back to the high logic level, at the same time.

3. The display panel driving unit of claim 1, wherein the power on reset signal only follows the high level reference voltage reset signal when the power on reset signal and the control signal have opposite logic levels.

4. The display panel driving unit of claim 1, wherein the control circuit comprises:
a logic gate configured to receive the high level reference voltage reset signal and the control signal, and output an output value; and
a switching element configured to receive the output value, wherein the switching element is turned on or off according to the output value.

5. The display panel driving unit of claim 4, wherein the logic gate is an XOR gate or an XNOR gate.

6. The display panel driving unit of claim 4, wherein the switching element is a field effect transistor that is supplied with the output value through a gate terminal and controls the power on reset signal by using a source terminal or a drain terminal.

7. A display device comprising:
a display panel including a plurality of gate lines and a plurality of data lines arranged in the display panel;
a gate driver respectively supplying gate signals to the plurality of gate lines;
a data driver respectively supplying data voltages to the plurality of data lines; and
a display panel driving unit comprising:
a timing controller configured to supply a power on reset signal for starting a sensing operation for pixel compensation during a sensing period before displaying an image, a gate driver control signal to the gate driver and a data driver control signal to the data driver;
a power management integrated circuit (PMIC) configured to supply a high level reference voltage reset signal to the timing controller, and generate a control signal; and
a control circuit connected between the PMIC and the timing controller, and configured to:

receive the high level reference voltage reset signal and the control signal from the PMIC, in response to the high level reference voltage reset signal transitioning from a high logic level to a low logic level and then from the low logic level back to the high logic level, shift the power on reset signal to transition from a high logic level to a low logic level and then from the low logic level back to the high logic level, in order to follow the high level reference voltage reset signal for restarting the sensing operation, and supply the power on reset signal to the timing controller, wherein both the high level reference voltage reset signal and the power on reset signal transition from the high logic level to the low logic level and then from the low logic level back to the high logic level, at the same time while the display panel is in a black screen state.

8. The display device of claim 7, wherein both the high level reference voltage reset signal and the power on reset signal transition from the high logic level to the low logic level and then from the low logic level back to the high logic level, at the same time.

9. The display device of claim 7, wherein the power on reset signal only follows the high level reference voltage reset signal when the power on reset signal and the control signal have opposite logic levels.

10. The display device of claim 7, wherein the control circuit comprises:
a logic gate configured to receive the high level reference voltage reset signal and the control signal, and output an output value; and
a switching element configured to receive the output value, wherein the switching element is turned on or off according to the output value.

11. The display device of claim 10, wherein the logic gate is an XOR gate or an XNOR gate.

12. The display device of claim 10, wherein the switching element is a field effect transistor that is supplied with the output value through a gate terminal and controls the power on reset signal by using a source terminal or a drain terminal.

13. A driving method of a display panel driving unit, the driving method comprising:
receiving an input voltage to a power management integrated circuit (PMIC) during a first time period for turning on a display panel;

supplying, via a timing controller, a power on reset signal maintained at a low logic level during a second time period after the first period;

in response to a control signal, supplied from the PMIC to a control circuit, transitioning from a low logic level to a high logic level or from a high logic level to a low logic level during a third time period after the second time period, pulling up the power on reset signal from the low logic level to the high logic level and supplying the power on reset signal from the control circuit to the timing controller for starting a sensing operation for pixel compensation during a sensing period before displaying an image;

receiving a high level reference voltage reset signal at a high logic level from the PMIC at a beginning of a fourth time period;

in response to the high level reference voltage reset signal transitioning from the high logic level to a low logic level and then from the low logic level back to the high logic level during the fourth time period, shifting the power on reset signal to transition from the high logic level to the low logic level and then from the low logic level back to the high logic level, in order to follow the high level reference voltage reset signal for restarting the sensing operation; and supplying the power on reset signal to the timing controller, wherein both the high level reference voltage reset signal and the power on reset signal transition from the high logic level to the low logic level and then from the low logic level back to the high logic level, at the same time while the display panel is in a black screen state during the fourth time period.

14. The driving method of claim 13, further comprising:
transitioning both the high level reference voltage reset signal and the power on reset signal from the high logic level to the low logic level and then from the low logic level back to the high logic level, at the same time during the fourth time period.

15. The method of claim 13, wherein the power on reset signal only follows the high level reference voltage reset signal when the power on reset signal and the control signal have opposite logic levels.

* * * * *